United States Patent
Oizumi et al.

(10) Patent No.: US 7,403,963 B2
(45) Date of Patent: Jul. 22, 2008

(54) RE-SAMPLING WITH AN ARBITRARY SCALING RATIO

(75) Inventors: Munenori Oizumi, Ibaraki (JP); Osamu Koshiba, Ibaraki (JP); Satoru Yamauchi, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 754 days.

(21) Appl. No.: 10/928,887

(22) Filed: Aug. 27, 2004

(65) Prior Publication Data

US 2005/0078020 A1    Apr. 14, 2005

Related U.S. Application Data

(60) Provisional application No. 60/498,555, filed on Aug. 28, 2003.

(51) Int. Cl.
*G06F 17/17* (2006.01)
*G06F 15/00* (2006.01)
*G06F 7/38* (2006.01)

(52) U.S. Cl. .................. 708/313; 708/200; 708/290
(58) Field of Classification Search ......... 708/270–277, 708/300–313, 200, 290
See application file for complete search history.

(56) References Cited

U.S. PATENT DOCUMENTS

| | | | | | |
|---|---|---|---|---|---|
| 5,475,628 | A | * | 12/1995 | Adams et al. | 708/313 |
| 5,497,152 | A | * | 3/1996 | Wilson et al. | 708/313 |
| 5,729,483 | A | * | 3/1998 | Brown | 708/313 |
| 5,768,311 | A | * | 6/1998 | Betts et al. | 708/313 |
| 6,141,671 | A | * | 10/2000 | Adams et al. | 708/313 |
| 6,208,671 | B1 | * | 3/2001 | Paulos et al. | 708/313 |
| 7,262,716 | B2 | * | 8/2007 | Yu et al. | 708/290 |

* cited by examiner

*Primary Examiner*—Chat C Do
(74) *Attorney, Agent, or Firm*—Robert D. Marshall, Jr.; W. James Brady; Frederick J. Telecky, Jr.

(57) ABSTRACT

A simple to implement sample rate conversion system consisting of an input/output data flow controller, interpolation coefficient generation, and output data flow control to generate the converted data stream. Sample rate conversion may be done at real time video rates, without restrictions on the conversion ratios.

3 Claims, 4 Drawing Sheets

RE-SAMPLING WITH AN ARBITRARY SCALING RATIO

CLAIM TO PRIORITY OF PROVISIONAL APPLICATION

This application claims priority under 35 U.S.C. §119(e)(1) of provisional application No. 60/498,555, filed Aug. 28, 2003.

TECHNICAL FIELD OF THE INVENTION

This invention relates to the field of digital sample rate conversion. More particularly, the invention relates to a novel and improved way of sample rate converting digitally sampled audio or video signals without restrictions on the conversion ratios.

BACKGROUND OF THE INVENTION

With the recent diversification in digital motion picture formats, such as DVD-video or digital TV broadcasting, the need for high-speed sampling-rate-change algorithm is growing. For example, video with 16:9 aspect ratio must be vertically squeezed to fit into conventional 4:3 display. Also, high-resolution signals such as DV (Digital Video), digital broadcast, or others often need to be scaled down before stored in storage such as HDD (Hard Disk Drive) or various rewritable DVD (Digital Versatile Disk). In addition, recent progresses in human-interfaces of players or displays have provoked the need for scaling down and up of motion pictures in many applications. Since, those applications are directly related to consumers, the method which realizes the scaling must be simple and relatively low cost to implement. These applications also require real time processing at video (or audio) rates, therefore the algorithm must be as fast as possible.

Some of the major methods used for sampling rate conversion are simple down-sampling, 0-th holding, interpolation, and oversampling. However, simple down sampling (removing of some portion of the input signals) can only be used for scaling down and 0-th holding (replicating parts of the input signals) only for scaling up. When the scaling ratio is not integral, 0-th holding and decimation must be sequentially applied. In both of these cases, the resulting signal must be filtered with a high quality low-pass filter to remove aliasing. The resultant quality is, to a large extent, dependent on the quality of the low pass filters.

Linear interpolation is an alternate method with a relatively high quality output, and fairly simple implementation. Although linear interpolation is much simpler than other interpolation methods, the conventional algorithms still lack either computational speed or flexibility.

In the linear interpolation method, the output pixel is produced using the intensities of the nearest two input pixels. FIG. 1 shows a case where a row of pixels is scaled to m/n size. Here, the first output pixel is assumed to be at the same point as the first input pixel. The spacing between two adjacent output-pixels is m/n of that of input pixels.

The conventional algorithm for linear interpolation consists of the following steps:

1. Determine the coordinates of an output pixel;
2. Find the two nearest input pixels 101 and 102;
3. Determine the distance 104 and 105 between the output pixel and the input pixels found in step 2; and
4. Determine the intensity of the output pixel by interpolation.

A division is required in step 2 and 3, resulting in an implementation that tends to be large and slow.

Another way to accomplish sample rate conversion with arbitrary ratios is the interpolation/decimation method shown in FIG. 2. While this will result in very good output quality, it is complex to implement, and is very computationally intensive.

In the high speed interpolation/decimation model, illustrated in FIG. 2, the sampled data input signal 201 is interpolated at some ratio (IRATIO) by inserting IRATIO-1 zero valued samples between each of the original input signal samples as shown by 202. The frequency domain characteristics of the input signal are unaltered by this operation, except that the zero-padded sequence is considered to be sampled at a frequency which is the product of original sampling frequency multiplied by IRATIO.

The zero-padded values are fed into a digital FIR low-pass filter to smooth or integrate the sequence, and limit the bandwidth of the filter output. The interpolated output signal shown by 203 has been quantized to a much finer time scale than the original sequence. The interpolated sequence is then passed to a zero-order hold functional block (physically implemented as a register) resulting in the output shown by 204 and then asynchronously resampled at the output sample frequency, resulting in the converted output shown by 205. This resampling can be thought of as a decimation operation since only a very few samples out of the great many interpolated samples are retained. The output values represent the "nearest" values, in a temporal sense, produced by the interpolation operation. There is always some error in the output sample amplitude. However, this error can be made arbitrarily small by using a very large interpolation ratio. While this approach gives excellent results, the computational requirements tend to limit it to audio applications with today's technology.

SUMMARY OF THE INVENTION

The invention described herein describes a novel and much simpler algorithm for digital sample rate conversion with arbitrary ratios. The conversion is performed using addition and subtraction only, with a single division that may be pre-computed. This enables a simple implementation that is capable of real time sample rate conversion at video rates.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
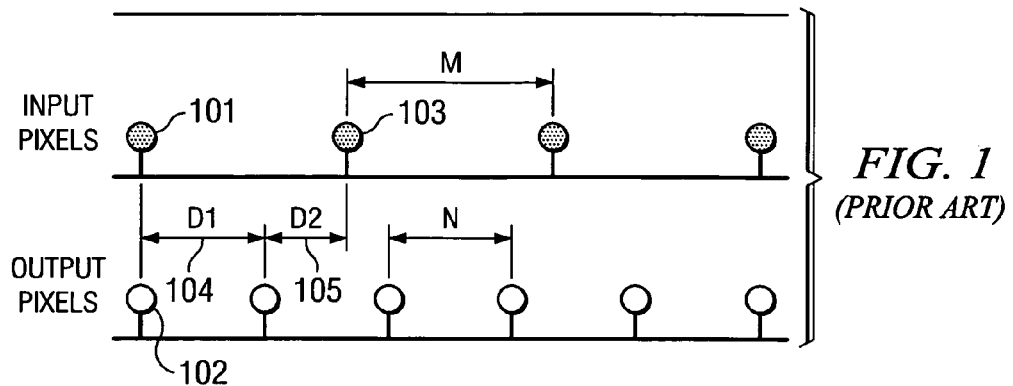
FIG. 1 illustrates linear interpolation (prior art)
Figure 2:
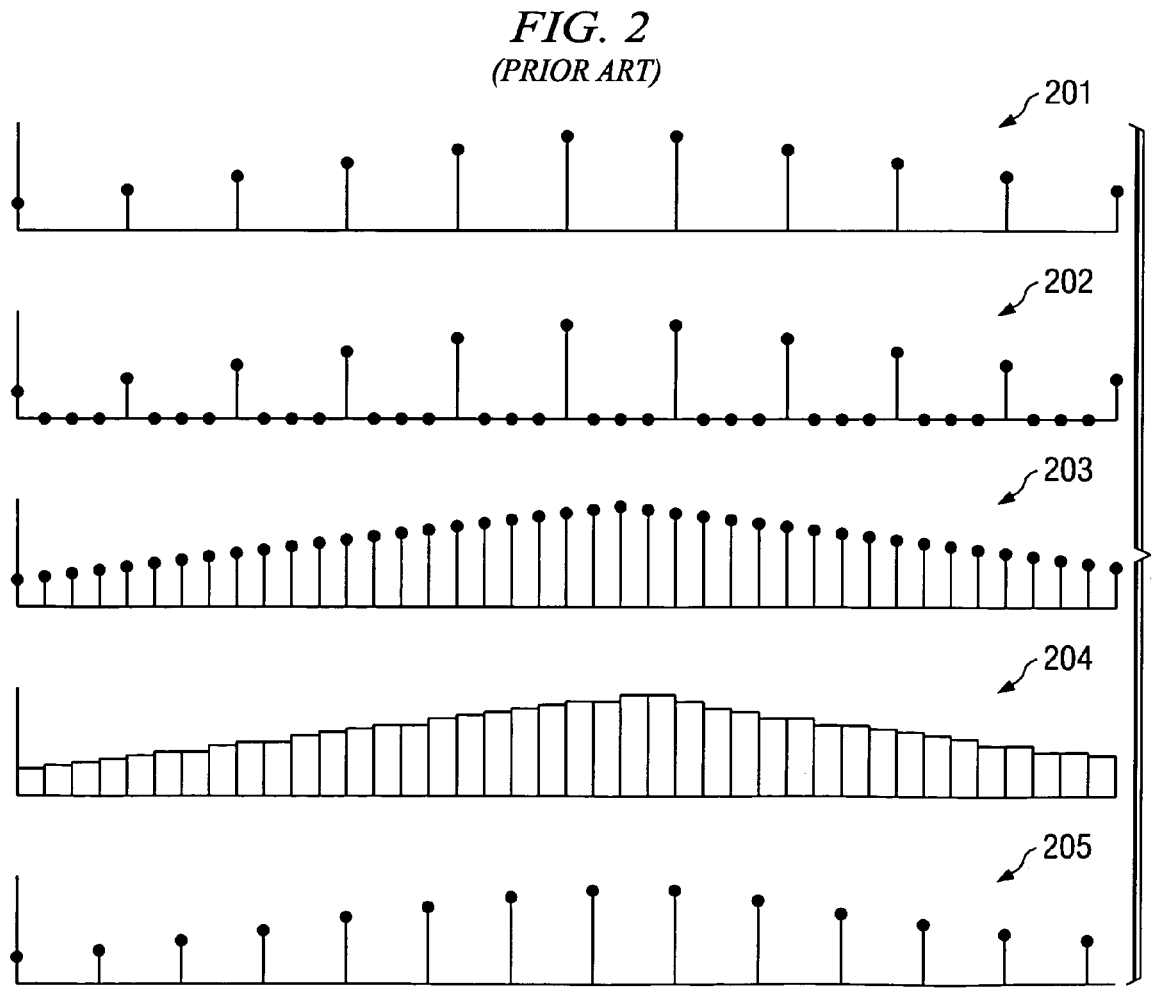
FIG. 2 illustrates the steps required in Interpolation/Decimation (prior art)
Figure 3:
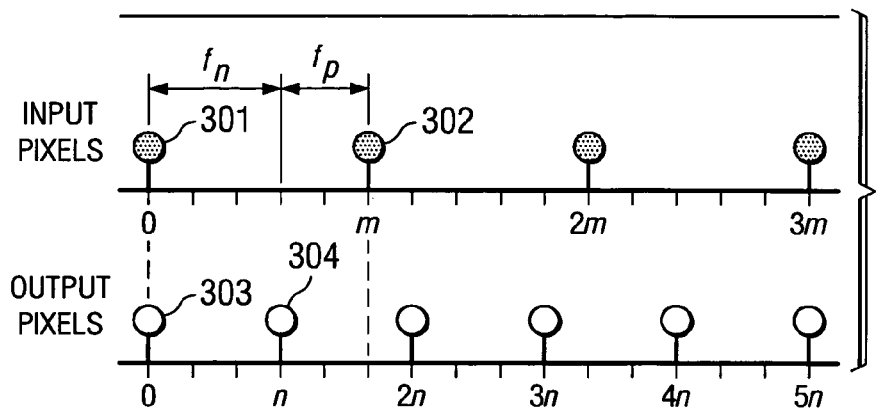
FIG. 3 demonstrates linear interpolation.

Assume the spacing between two adjacent input signals 301 and 302 is m, and the spacing between two adjacent output signals 303 and 304 is n as shown in FIG. 3. The number of output pixels produced between two adjacent input pixel x and pixel x+1 is ((x+1)m mod n)−(xm mod n).

Let a counter for input pixels be i, and count it up by m for each input pixel. If i is larger than or equal to n, there is one output pixel between the input pixel and the previous pixel. (Here, the two nearest input signals are determined.) Then, subtract m from i. If i is still larger than or equal to n, there is another output pixel. Continue this until i becomes smaller than n. Then move to the next input pixel.

The distance between the output pixel and the nearest two input pixels can be expressed by simple numerical array. Since the first output pixel is at the same location as the first input pixel, $f_p(0)$ (the distance between the 0th output pixel and the previous input pixel) is 0. Also, $f_n(0)$, (the distance between the 0th output pixel and the current input pixel) is n. Since the spacing between two adjacent output pixels is n, $f_p(1)$ is larger than $f_p(0)$ by n. Since $f_p(x)$ is smaller than m:

$$f_p(1)\{f_p(0)+n\} \bmod m = \begin{cases} f_p(0)+(n \bmod m) & (f_p(0)+(n \bmod m) \le m) \\ f_p(0)+(n \bmod m)-m & (f_p(0)+(n \bmod m) > m) \end{cases}.$$

Similarly, $$f_n(1) = \{f_n(0)-n\} \bmod m = \begin{cases} f_n(0)-(n \bmod m) & (f_n(0)-(n \bmod m) \ge 0) \\ f_n(0)-(n \bmod m)+m & (f_n(0)-(n \bmod m) < 0) \end{cases}.$$

For any integer x, $$f_p(x+1) = \{f_p(x)+n\} \bmod m = \begin{cases} f_p(x)+(n \bmod m) & (f_p(x)+(n \bmod m) \le m) \\ f_p(x)+(n \bmod m)-m & (f_p(x)+(n \bmod m) > m) \end{cases}$$

$$f_n(x+1) = \{f_n(x)-n\} \bmod m = \begin{cases} f_n(x)-(n \bmod m) & (f_n(x)-(n \bmod m) \ge 0) \\ f_n(x)-(n \bmod m)+m & (f_n(x)-(n \bmod m) < 0) \end{cases}.$$

Using this method, factors used in interpolation can be easily calculated. Also, in this calculation, no division is used except (n mod m) which only need be calculated once at the beginning. This value can be precalculated or may be calculated when needed without time constrain or penalty. Implementation of this algorithm is straightforward, as shown in the following flow charts.

Figure 4:
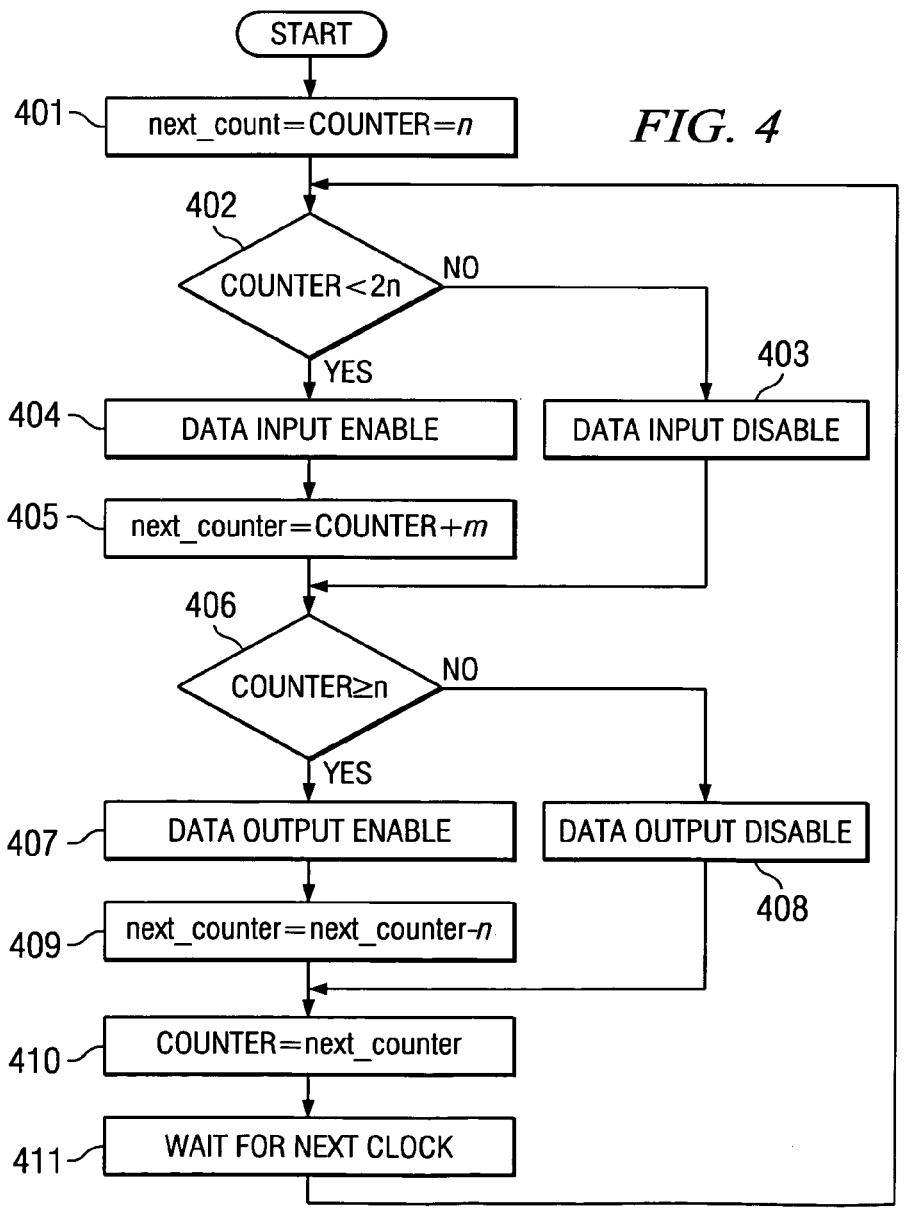
FIG. 4 illustrates the operation of the input/output data flow controller.

FIG. 4 describes the Input/Output data flow control algorithm. Block 401 initializes the counters next_counter and counter to the value of n. Decision block 402 tests whether counter is less than 2n. If it is, control passes to block 404, where the data input is enabled. Next block 405 next_counter is set to counter+m, thus counting up by m for each input pixel.

If the test in block 402 fails, thus indicating that there will be more than one output pixel for each input pixel, control passes to block 403 where the data input is disabled.

Control from blocks 405 and 403 pass to decision block 406, where the value of counter is tested whether it is equal to or greater than n. If it is, data output is enabled in block 407, and then next_counter is decremented by n in block 409. If the test in block 406 fails, data output is disabled in block 408.

Control from blocks 408 and 409 then pass to block 410 where counter is set to next_counter. Proceeding to block 411, the system enters a wait state. Upon receiving the next clock pulse, control is returned to decision block 402.

Figure 5:
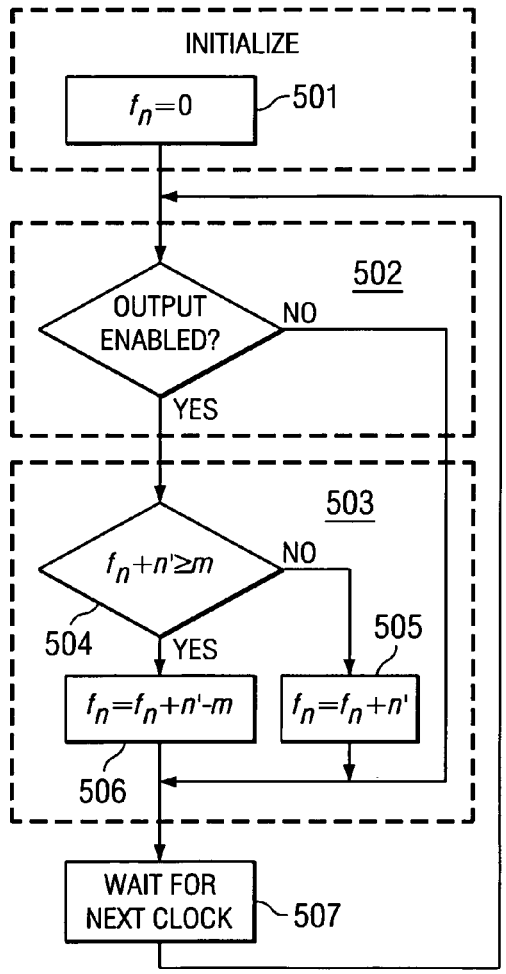
FIG. 5 is a flow chart for calculating interpolation coefficient $f_n$.
Figure 6:
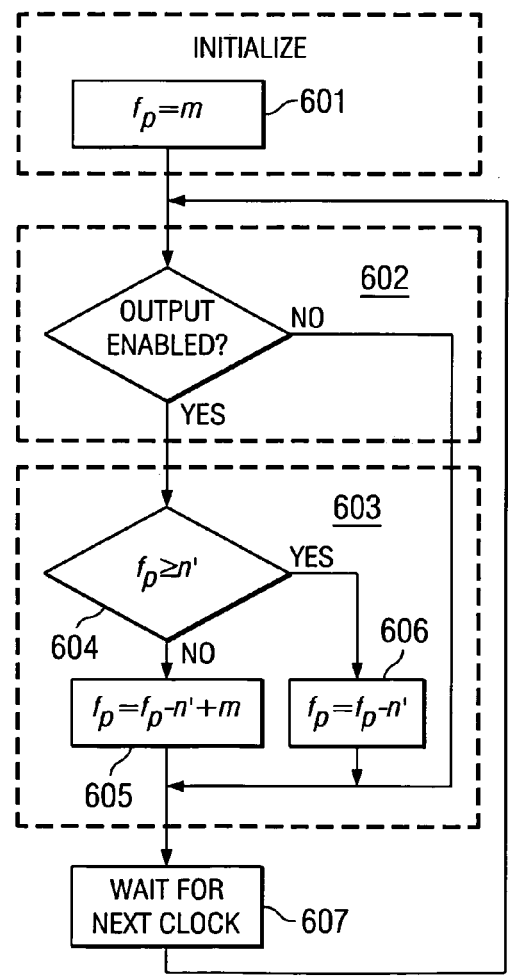
FIG. 6 is a flow chart for calculating interpolation coefficient $f_p$.

FIGS. 5 and 6 show the algorithm used in calculating the interpolation coefficients $f_p$ and $f_n$ where $f_n$ is the coefficient for the preceding input data point, and $f_p$ is to the succeeding one. In the $k^{th}$ cycle:

$$f_n = (m-(kn \bmod m))$$

and $$f_p = (kn \bmod m)$$

where $f_n$ is calculated by first initializing $f_n$ to 0 in block 501. Block 502 then tests whether data output is enabled as previously shown in block 407 of FIG. 4. If output is enabled, block 503 calculates $f_n$. Within block 503, decision block 504 tests if $f_n$+n' is greater than or equal to m, where n' is equal to n mod m. If it is, $f_n$ is calculated by the equation:

$$f_n = f_n+n'-m$$

If the test fails, the equation:

$$f_n = f_n+n'$$

is used. After either case, control passes to block 507 where the system waits until the next clock cycle is detected.

Next, interpolation coefficient $f_p$ is calculated, as shown on FIG. 6. Block 601 initializes $f_p$ to the value of m. Block 602 then tests whether data output is enabled as previously shown in block 407 of FIG. 4. If output is enabled, block 603 calculates $f_p$. Within block 603, block 604 tests if $f_p$ is equal to or greater than n', where n' is equal to n mod m. If it is, $f_p$ is calculated in block 606 using the equation:

$$f_p = f_p-n'$$

If the test fails, the equation:

$$f_p = f_p-n+m$$

is used. In either case, control passes to block 607 where the system waits for the next clock cycle.

Figure 7:
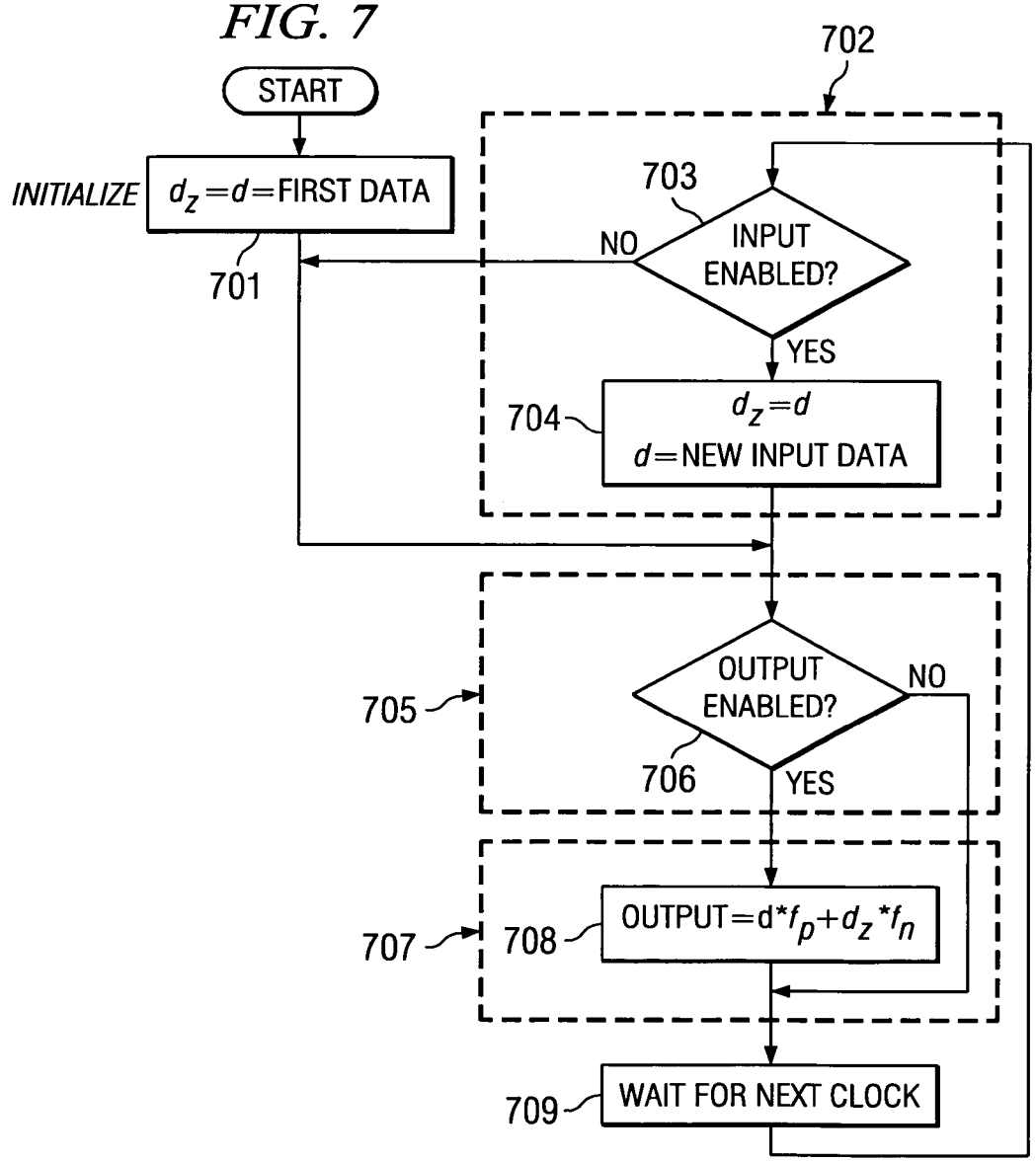
FIG. 7 is a flow chart showing the output calculations.

Once the interpolation coefficients are calculated, the actual data flow is shown in FIG. 7. The algorithm consists of three major sections. Block 702 implements up sampling by $0^{th}$ hold, decimation is done in block 705, and the output signal is calculated by linear interpolation in block 707 using the coefficients previously calculated.

Block 701 initializes the system by setting both dz and d equal to the first data value.

Decision block 703 tests whether data input is enabled by the data flow controller shown in block 404 of FIG. 4. If it is, block 704 sets $d_z$ equal to d and sets d equal to the new input data, and continues to block 706. If the test fails, this step is bypassed, and control passes directly to block 706.

Block 706 tests if data output is enabled by the data flow controller in block 407 of FIG. 4. If it is, block 708 calculates the output value using the previously calculated coefficients and the following equation:

$$\text{Output} = d^*f_p+d_z^*f_n$$

Control then passes to block 709, where the system waits for the next clock cycle. If the test fails, control from block 706 continues directly to block 709.

Although the invention has been described in detail with reference to its preferred embodiments, it is to be understood that this description is by way of example only and is not to be construed in a limiting sense.

Moreover, numerous changes in the details of the embodiments of the invention will be apparent to persons of ordinary skill in the art having reference to this description. It will also be apparent that the algorithms and methods described may be equally well implemented in hardware or software. It is contemplated that such changes and additional embodiments are within the spirit and true scope of the invention as claimed below.

What is claimed is:

1. A method of converting an input sampled digital data stream sampled at an input rate of m into an output sampled digital data stream sampled at an output rate of n, comprising the steps of:

initializing a first count and a second count to n;

for each clock pulse determining if said second count is less than 2n, then if so, enabling data input, inputting a next value of said input sampled digital data stream and setting said first count equal to a sum of said second count and m, and if not, disabling data input, determining if said second count is greater than or equal to n, then if so, enabling data output and setting said first count equal to a difference of a prior first count minus n, if not, disabling data output, and setting said second count equal to said first count;

initializing a first data value and a second data value to a first input data value; and for each clock pulse determining if data input is enabled and if so, setting said second data value to a first data value of said input sampled digital data stream then setting said first data value equal to a most recently received data input value of said input sampled digital data stream, and determining if data output is enabled and if so, outputting a next output value of said output sampled digital data stream equal to $$d_2 * f_p + d_2 * f_n$$

where: $d_1$ is said first data value; $d_2$ is said second data value; $f_p$ is a first interpolation value; and $f_n$ is a second interpolation value.

2. The method of claim 1, further comprising the step of:

determining said first interpolation value $f_p$ as follows initializing said first interpolation value $f_p$ to m, for each clock pulse determining if data output is enabled, then if not, leaving said first interpolation value $f_p$ unchanged, if so, determining if said first interpolation value $f_p$ is greater than or equal to n mod m, then if so, setting said first interpolation value $f_p$ equal to a prior first interpolation value $f_p$ minus n mod m, and if not, setting said first interpolation value $f_p$ equal to a prior first interpolation value $f_p$ minus n mod m plus m.

3. The method of claim 1, further comprising the step of:

determining said second interpolation value $f_n$ as follows initializing said first interpolation value $f_n$ to zero, for each clock pulse determining if data output is enabled, then if not, leaving said second interpolation value $f_n$ unchanged, if so, determining if a sum of said second interpolation value $f_n$ and n mod m is greater than or equal to m, then if so, setting said second interpolation value $f_n$ equal to a prior second interpolation value $f_n$ plus n mod m minus m, and if not, setting said second interpolation value $f_n$ equal to a prior second interpolation value $f_n$ plus n mod m.

* * * * *